(12) United States Patent
Casper

(10) Patent No.: US 6,512,412 B2
(45) Date of Patent: *Jan. 28, 2003

(54) TEMPERATURE COMPENSATED REFERENCE VOLTAGE CIRCUIT

(75) Inventor: Stephen L. Casper, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 13 days.

(21) Appl. No.: 09/250,592

(22) Filed: Feb. 16, 1999

(65) Prior Publication Data

US 2002/0014913 A1 Feb. 7, 2002

(51) Int. Cl.⁷ .................................................. G05F 1/10
(52) U.S. Cl. ...................... 327/538; 327/378; 327/513; 327/543; 326/34
(58) Field of Search ................................. 327/512, 513, 327/378, 538, 539, 540, 541, 543; 326/33, 34; 323/313, 315, 316

(56) References Cited

U.S. PATENT DOCUMENTS

| | | | | |
|---|---|---|---|---|
| 4,298,835 A | * | 11/1981 | Rowe | 323/281 |
| 4,800,303 A | * | 1/1989 | Graham et al. | 327/112 |
| 4,847,547 A | * | 7/1989 | Eng, Jr. | 320/35 |
| 5,537,871 A | * | 7/1996 | Itsuji et al. | 73/204.17 |
| 5,545,983 A | * | 8/1996 | Okeya et al. | 327/513 |
| 5,659,264 A | * | 8/1997 | Ariyoshi et al. | 327/513 |
| 5,661,428 A | | 8/1997 | Li et al. | 323/313 |
| 5,694,090 A | | 12/1997 | Morgan | 331/57 |
| 5,739,681 A | * | 4/1998 | Allman | 323/314 |
| 5,795,069 A | * | 8/1998 | Mattes et al. | 327/513 |
| 5,796,244 A | * | 8/1998 | Chen et al. | 323/313 |
| 5,898,343 A | | 4/1999 | Morgan | 331/57 |

OTHER PUBLICATIONS

Schilling at al, Electronic Circuit, 1989, pp. 145–160.*

* cited by examiner

Primary Examiner—Timothy P. Callahan
Assistant Examiner—An T. Luu
(74) Attorney, Agent, or Firm—Schwegman, Lundberg, Woessner & Kluth, P.A.

(57) ABSTRACT

An integrated circuit voltage regulator compensates for temperature variations by adjusting a gain of an amplifier. In one embodiment, the gain is controlled by a voltage divider circuit comprised of a first resistor having a first temperature coefficient, and a second resistor having a second temperature coefficient which is different from the first coefficient. In one embodiment, the first resistor is a p-channel transistor and the second resistance is fabricated from integrated circuit active area.

11 Claims, 3 Drawing Sheets

TEMPERATURE COMPENSATED REFERENCE VOLTAGE CIRCUIT

TECHNICAL FIELD OF THE INVENTION

The present invention relates generally to reference voltage circuits and in particular the present invention relates to temperature controlled gain adjust circuits.

BACKGROUND OF THE INVENTION

Integrated circuits form the basis for many electronic systems. Essentially, an integrated circuit includes a vast number of transistors and other circuit elements that are formed on a single semiconductor wafer or chip and are interconnected to implement a desired function. The complexity of these integrated circuits requires the use of an ever increasing number of linked transistors and other circuit elements.

Integrated circuits such as memory devices, microprocessors, controllers and application—specific integrated circuits (ASIC's) often include internal voltage regulator circuits. These internal voltage regulators provide an internal reference voltage, often referred to as VCCR. Because the integrated circuits are operating at relatively low voltages, the internal voltage regulator performance can be adversely affected by variations in temperature. It is desired to provide a reference voltage which increases in value as temperature increases.

For the reasons stated above, and for other reasons stated below which will become apparent to those skilled in the art upon reading and understanding the present specification, there is a need in the art for an integrated circuit voltage regulator which compensates for temperature variations.

SUMMARY OF THE INVENTION

The above mentioned problems with integrated circuit voltage regulators are addressed by the present invention and will be understood by reading and studying the following specification.

In one embodiment, an integrated circuit voltage regulator comprises an amplifier circuit having a first input coupled to receive an input voltage and provide an output voltage at an output node, and a gain adjust circuit connected to the amplifier circuit for adjusting a gain of the amplifier circuit. The gain adjust circuit comprises a voltage divider circuit having first and second series coupled resistors. The first resistor has a first temperature coefficient and the second resistor has a second temperature coefficient which is different from the first temperature coefficient such that a voltage on a node intermediate the first and second series coupled resistors changes in response to temperature changes experienced by the first and second series coupled resistors.

In another embodiment, a memory device comprises an array of memory cells, control circuitry for controlling read and write access operations on the memory cells, and a voltage regulator. The voltage regulator comprises an amplifier circuit having a first input coupled to receive an input voltage and provide an output voltage at an output node, and a gain adjust circuit connected to the amplifier circuit for adjusting a gain of the amplifier circuit. The gain adjust circuit comprises a voltage divider circuit having first and second series coupled resistors. The first resistor has a first temperature coefficient and the second resistor has a second temperature coefficient which is different from the first temperature coefficient such that a voltage on a node intermediate the first and second series coupled resistors changes in response to temperature changes experienced by the first and second series coupled resistors.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
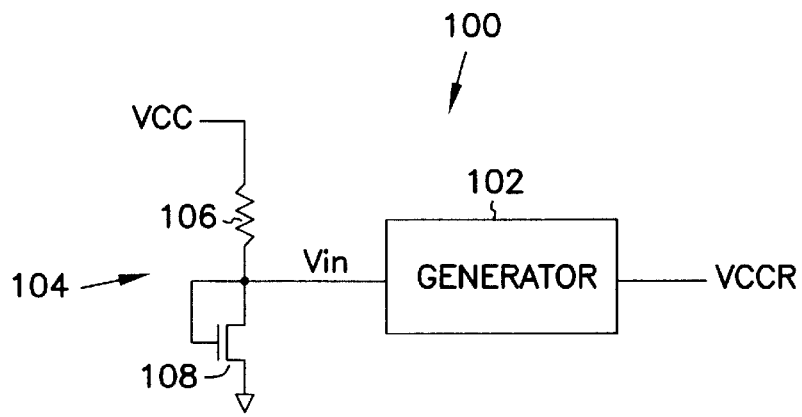
FIG. 1 is a prior art voltage regulator.

Referring to FIG. 1, a prior art reference voltage regulator circuit 100 is illustrated. The reference voltage regulator includes an amplifier circuit 102 which provides the reference voltage, VCCR, based upon a fixed gain value. An input voltage circuit 104 provides an input voltage, Vin, to the amplifier circuit. The input voltage circuit comprises a resistor 106 coupled in series with a transistor 108. Transistor 108 in an n-channel FET with a gate connected to its drain to operate as a diode. The resistor and diode are coupled between an upper voltage supply, Vcc, and a lower ground potential. During operation, the series coupled resistor and diode operate as a voltage divider circuit where the voltage drop across the diode (Vt) provides the input voltage. It will be appreciated by those skilled in the art that the threshold voltage, Vt, of the diode increases as temperature decreases. This circuit, therefore, provides an inverse relationship between temperature and VCCR.

Figure 2:
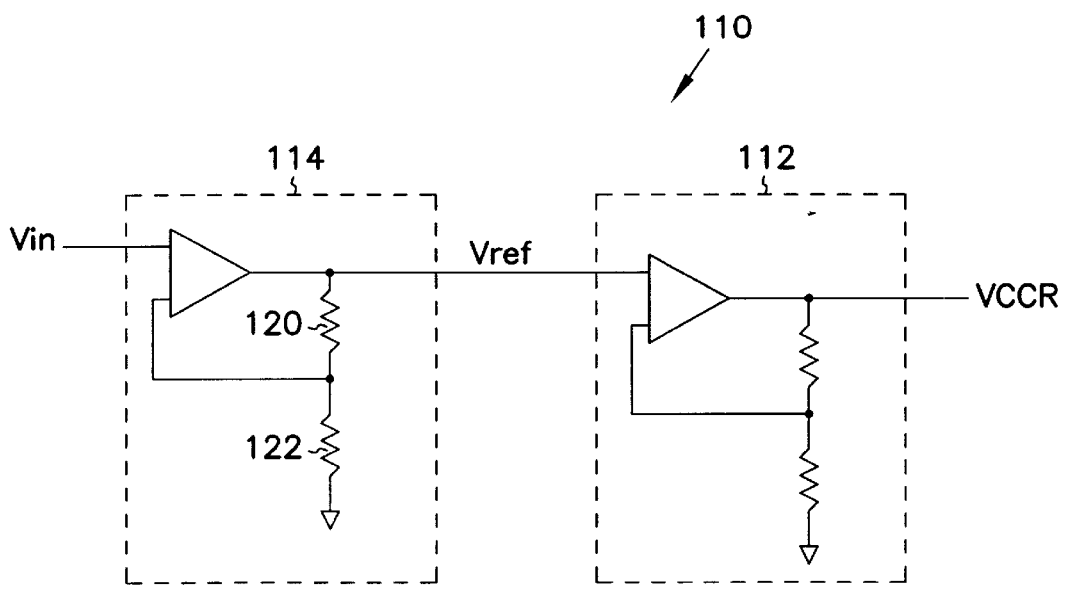
FIG. 2 is a prior art amplifier circuit.

One prior art voltage amplifier circuit 110 is illustrated in FIG. 2. The amplifier circuit includes an output amplifier stage 112 which provides the reference voltage, VCCR. An input amplifier stage 114 provides an input voltage, Vref, to the output amplifier stage. The input amplifier stage has a fixed gain which is controlled by series coupled resistors 120 and 122. The series coupled resistors could be fabricated using any known integrated circuit process, but are typically fabricated using either active area or poly silicon. The circuit illustrated in FIG. 2 remains relatively stable over temperature variations, because the series coupled resistors experience the same proportional change in resistance over temperature changes. That is, because each resistor is fabricated from the same material, the ratio of the voltage divider circuit (series coupled resistors) remains relatively constant over temperature changes. As stated above, input voltage circuit 104 is inversely proportional to temperature changes. Complicated input voltage circuits can be used to provide an input voltage, Vin, which changes in a manner which is directly proportionate to temperature changes. These various input voltage circuits are not desired due to their complexity. Recognizing this problem, a voltage regulator circuit for providing a VCCR which increases as temperature increases is described herein.

Figure 3:
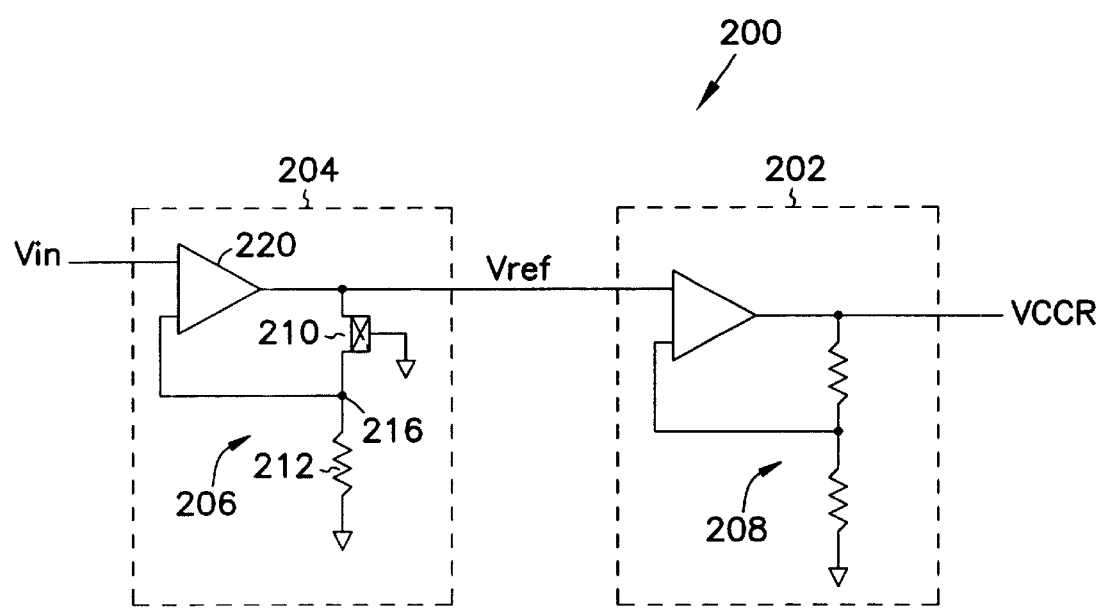
FIG. 3 is an integrated circuit and voltage regulator circuit of the present invention.

FIG. 3 illustrates one embodiment of a voltage regulator circuit 200 of the present invention which can be incorporated in an integrated circuit to provide an internal reference voltage, VCCR. The voltage regulator circuit includes an output amplifier stage 202 coupled to receive a reference voltage, Vref, from an input amplifier stage 204. Each amplifier stage has a gain which is controlled by a gain adjust circuit, illustrated as voltage divider circuit 206 or 208. The voltage divider circuits comprise first and second series coupled resistors. One or more of the voltage divider circuits, however, are constructed using resistors which have different temperature coefficients. For example, voltage divider circuit 206 provided in the input amplifier stage comprises a long-L p-channel transistor 210 coupled in series with an active area resistor 212. The long-L transistor, as known to those in the art, has a large channel region to allow for large source-drain currents. The first resistor, therefore, is a source to drain resistance of the transistor. An intermediate node 216 is coupled to an input of amplifier 220 to establish the amplifier gain. As the temperature experienced by the circuit increases, the resistance of the long-L transistor changes as a function of temperature more than the active area resistor. The voltage on the intermediate node changes as temperature changes to allow the gain of the input amplifier stage to increase as temperature increases. The present invention, therefore, does not focus on controlling the input voltage, Vin, but instead provides a novel way of controlling the VCCR voltage by adjusting an amplifier gain.

Although the gain control of the input amplifier stage of FIG. 3 includes a voltage divider circuit 206 having resistors 210 and 212 with different temperature coefficients, an alternate embodiment of the present invention provides a gain control on the output amplifier stage 208 which increases amplifier gain as temperature increases. Further, it will be appreciated that different voltage regulator circuits can be provided using more or less amplifier stages. That is, the present invention can be embodied in an integrated circuit having one amplifier stage, or alternatively more than two amplifier stages.

The embodiment illustrated in FIG. 3, includes a voltage divider circuit comprising p-channel transistor 210 and a series coupled resistor 212. The present invention, however, is not limited to the use of the series coupled transistor and resistor. Alternate embodiments of the present invention can be provided using any two types of resistive elements in the voltage divider which exhibit different temperature coefficients. For example, resistive elements can be fabricated from active area, poly silicon or other semiconductor material, transistors, diodes or the like which provide a resistive path. The voltage divider ratio, therefore, changes as a function of temperature to provide the desired gain changes in the amplifier circuit.

The Vin voltage can be generated in a variety of different manners without departing from the present invention. For example, the voltage divider circuit of FIG. 1 can be used. The regulator 200, however, provides an increased amplification of Vin as temperature increases. While the above described embodiment uses a voltage divider circuit having a first resistive path (through transistor 210) and a second resistive path (through resistor 212), other amplifier gain circuits which adjust the gain of an amplifier in response to temperature changes can be provided as different embodiments of the invention. Further, the voltage divider circuit can have the elements in a different order. That is, a resistor which has a greater change in resistance can be located between node 216 and ground.

Table 1 illustrates the resultant voltages and gains for two circuits. Circuit 1 includes two amplifier stages which have a constant gain over temperature. It can be seen that as Vin changes over the temperature range of 0 to 85 degrees C., Vccr changes by 0.24 volts. Circuit 2 is one embodiment of the circuit of FIG. 3 having an adjustable gain. Amplifier 204 includes resistor 212 (R1) is fabricated from N+ active area and changes resistance by approximately 5% over a temperature change of 0 to 85 degrees C., and a resistor (R2) fabricated as a long-L transistor 210 which changes resistance by approximately 10% over the same temperature range.

TABLE 1

|  | Vin | Gain (Vref) | Vref | Gain (Vccr) | Vccr |
| --- | --- | --- | --- | --- | --- |
| Circuit 1 | | | | | |
| 85° C. | .6 | 4.70 | 2.82 | 1 | 2.82 |
| 0° C. | .65 | 4.70 | 3.06 | 1 | 3.06 |
| Circuit 2 | | | | | |
| 85° C. | .6 | 4.70 | 2.82 | 1 | 2.82 |
| 0° C. | .65 | 4.51 | 2.93 | 1 | 2.93 |

Gain is defined as 1+R2/R1. Assuming that R1=1 and R2=3.7, Gain (Vref) at 85° C. is equal to 1+R2/R1, or 1+3.7/1. Taking into consideration the resistance changes over temperature, Gain (Vref) at 0° C. is equal to 1+R2/R1, or 1+(3.7*0.9)/(1*0.95)=4.51. The change in Vccr using Circuit 2 is 0.11 volts over a temperature change of 0 to 85 degrees C., a significant improvement over Circuit 1 which does not adjust gain. Again, these values are merely representative of one embodiment and changes in voltages and amplifier gains are well within the scope of the present invention.

Figure 4:
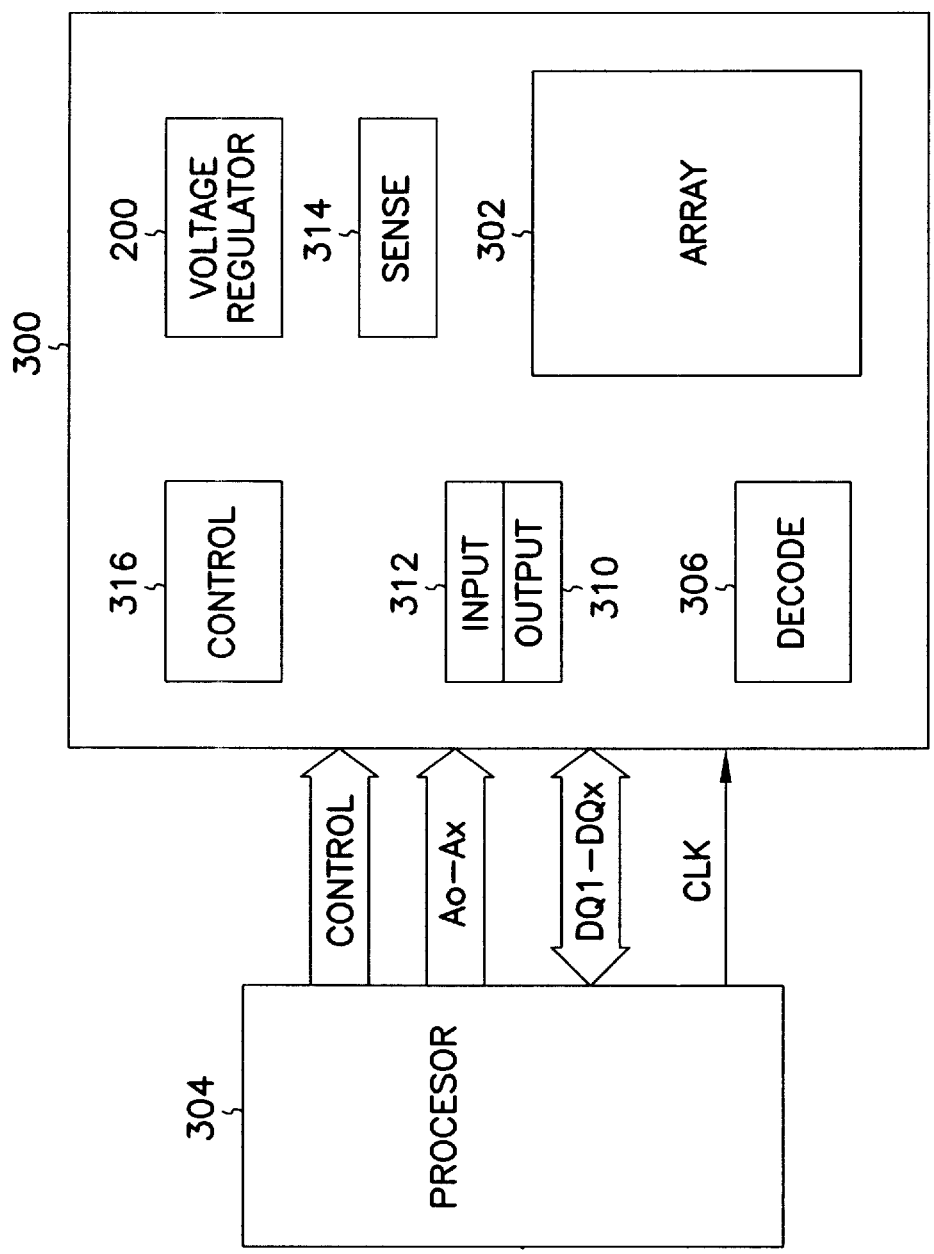
FIG. 4 is a memory device incorporating a temperature compensated voltage regulator.

A DRAM 300 is illustrated in FIG. 4 as having a memory array 302 and associated circuitry for reading from and writing to the memory array. The memory array is arranged in groups of memory cells, and the array can be arranged in rows and columns. The DRAM array can be accessed by an external device, such as a microprocessor 304, memory controller, a chip set, or other external system through input/output connections including address lines A0-Ax. A decoder 306 decodes an address signal provided on A0-Ax, and addresses the corresponding area of the DRAM array. Data stored in the DRAM array can be transferred to outputs DQ1-DQx through the data output buffer 310. Likewise, data input buffer 312 is used to receive data from DQ1-DQx and transfer the data to the DRAM array. Sense amplifier circuitry 314 is provided to sense and amplify data stored on the individual memory cells of the DRAM array. Control circuitry 316 is provided to monitor the memory circuit inputs and control reading and writing operations. An optional clock signal can be provided by the microprocessor for operating the memory circuit in a synchronous mode. The DRAM includes a temperature compensated internal voltage regulator incorporating the present invention to provide an internal voltage.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

The present invention provides an integrated circuit voltage regulator which compensates for temperature variations by adjusting a gain of an amplifier. In one embodiment, the gain is controlled by a voltage divider circuit comprising a first resistor having a first temperature coefficient, and a second resistor having a second temperature coefficient which is different from the first coefficient. In one embodiment, the first resistor is a p-channel transistor and the second resistance is fabricated from integrated circuit active area. The present invention can be provided in any integrated circuit, including but not limited to, application specific integrated circuits (ASICs), memory devices, processors, or memory controllers. Likewise, the memory devices can include any random access memory (DRAM, SRAM, SDRAM, DDR DRAM, SDR DRAM, RDRAM, SLDRAM or the like), non-volatile memory, or static memories.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention is limited only by the claims and the equivalents thereof.

What is claimed is:

1. An integrated circuit voltage regulator comprising:

an amplifier having a first input coupled to receive an input voltage, a second input, and an output node having an output voltage, wherein the input voltage decreases as temperature increases and increases as temperature decreases; and a gain adjust circuit connected to the amplifier for adjusting a gain of the amplifier, the gain adjust circuit including a nonlinear device and a linear device coupled in series;

wherein the linear device is a resistor having a first terminal and a second terminal;

wherein the nonlinear device is a transistor including a gate, a drain and a source, one of the source and the drain of the transistor being connected to the first terminal of the resistor, the other of the source and the drain of the transistor being connected to the output node of the amplifier circuit, the gate being connected to ground;

wherein the first terminal of the resistor is connected to the second input of the amplifier; and wherein the nonlinear device defines a first temperature-dependent resistance, wherein the linear device defines a second temperature-dependent resistance, the first temperature-dependent resistance changes at a greater rate than the second temperature-dependent resistance changes whereby the temperature effect of the input voltage is minimized by the gain adjust circuit when producing the output voltage.

2. The circuit of claim 1, wherein the first temperature-dependent resistance changes at twice the rate of the second temperature-dependent resistance over a same temperature range.

3. The circuit of claim 1, wherein the first temperature-dependent resistance changes at rate of 10% and the second temperature-dependent resistance changes at a rate of 5% over a same temperature range.

4. The integrated circuit voltage regulator of claim 1, wherein the output voltage is an internal reference voltage in an integrated circuit.

5. The integrated circuit voltage regulator of claim 4, wherein the internal reference voltage is in a DRAM.

6. The integrated circuit voltage regulator of claim 4, wherein the internal reference voltage is Vccr.

7. The integrated circuit voltage regulator of claim 1, wherein the second terminal of the resistor is connected to ground.

8. The integrated circuit voltage regulator of claim 1, wherein the nonlinear transistor is a long L transistor.

9. The integrated circuit voltage regulator of claim 8, wherein the nonlinear transistor is a p-channel transistor.

10. The integrated circuit voltage regulator of claim 8, wherein the nonlinear transistor is a large source-drain current transistor.

11. An integrated circuit for producing, from an input voltage, an essentially constant reference voltage having minimized temperature effects, comprising:

an amplifier including a first input coupled to receive an input voltage, a second input, and an output node having an output voltage, wherein the input voltage decreases as temperature increases and increases as temperature decreases; and a gain adjust circuit connected to the amplifier for adjusting a gain of the amplifier, the gain adjust circuit including a nonlinear, long-L p-channel transistor and an active area resistor, wherein the resistor includes a first terminal and a second terminal, wherein the transistor includes a source, a drain and a gate, wherein one of the source and the drain is connected to the output node, wherein the other of the source and the drain is connected to both the first terminal and the second input, wherein the gate is connected to ground, wherein the second terminal is connected to ground, and wherein a source-to-drain resistance of the transistor changes as a function of temperature more than a resistance of the active area resistor whereby the effects of temperature on the output voltage are minimized.

* * * * *